United States Patent [19]

Curtice

[11] Patent Number: 4,639,752
[45] Date of Patent: Jan. 27, 1987

[54] FAST TERNARY (GAINAS) LOGIC GATE DEVICE

[75] Inventor: Walter R. Curtice, Princeton Junction, N.J.

[73] Assignee: RCA Corporation, Princeton, N.J.

[21] Appl. No.: 755,828

[22] Filed: Jul. 17, 1985

Related U.S. Application Data

[63] Continuation-in-part of Ser. No. 595,529, Mar. 30, 1984.

[51] Int. Cl.⁴ .................... H01L 29/78; H01L 29/20
[52] U.S. Cl. .................................... 357/16; 357/23.2; 357/23.3; 357/23.11; 357/23.12
[58] Field of Search ................ 357/23.3, 23.11, 23.12, 357/23.2, 16

[56] References Cited

U.S. PATENT DOCUMENTS

| | | | |
|---|---|---|---|
| 4,132,998 | 1/1979 | Dingwall | 357/23.3 |
| 4,374,391 | 2/1983 | Camlibel et al. | 357/17 |

OTHER PUBLICATIONS

Sze, S. M., *Physics of Semiconductor Devices*, Wiley & Sons, N.Y., p. 488.
Narayan et al., "Growth . . . Application", RCA Review, vol. 42, Dec. 1981, pp. 492–506.
Dr. M. Fogiel, *Modern Microelectronic Circuit Design*, IC Applications, Fabrication Technology, vol. 1, Research & Ed. Association, Copyright 1981, pp. 440–442.
P. D. Gardner, et al., "GaInAs Deep Depletion and Inversion Mode MISFETS", Inst. Phys. Conf. Ser. No. 65: Chapter 5, Paper-Int. Symp. GaAs and Related Compounds, Albuquerque, 1981, pp. 399–406.
J. Degani, et al., "Velocity Field Characteristics of Minority Carriers (Electrons) in p-InGaAs", Appl. Phys. Lett. 39(7), 1 Oct. 1981, pp. 569–572.
P. D. Gardner, et al., "GaInAs Metal Insulator Field-Effect Transistors (MISFETs) For Microwave Frequency Applications", RCA Review, vol. 42, Dec. 1981, pp. 542–556.
S. M. Sze, *Physics of Semiconductor Devices*, John Wiley & Sons, Copyright 1981, p. 77, (Copyright 1969, p. 89).

*Primary Examiner*—Martin H. Edlow
*Assistant Examiner*—Jerome Jackson, Jr.
*Attorney, Agent, or Firm*—Birgit E. Morris; William J. Burke; Henry Steckler

[57] ABSTRACT

A semiconductor structure GaInAs provides significantly low output capacitance in a digital integrated circuit, such as an inverter. A dopant density (N) within the range of $1.0 \times 10^{16}$ cm$^{-3}$ and $4.7 \times 10^{16}$ cm$^{-3}$ and an active layer thickness (a) within the range of 0.15 micrometer and 0.33 micrometer are selected in proper combination to provide a design criterion to provide good device performance with a significantly small propagation delay between the input and output terminals.

10 Claims, 3 Drawing Figures

FAST TERNARY (GAINAS) LOGIC GATE DEVICE

The Government has rights in this invention pursuant to a Government contract.

This application is a continuation-in-part of application Ser. No. 595,529, filed March 30, 1984.

This invention relates to semiconductor devices and more particularly to an integrated circuit structure formed of ternary material, such as gallium indium arsenide (GaInAs).

BACKGROUND OF THE INVENTION

It is known that ternary material, such as gallium indium arsenide (GaInAs), shows great promise for use in semiconductor devices due to its high electron mobility and large saturation velocity. See an article in Appl. Phys. Letter 39(7), 1 Oct. 1981, pp. 569–572, by J. Degani, et al., entitled "Velocity Field Characteristics Of Minority Carriers (Electrons) In p-$In_{0.53}Ga_{0.47}As$" for a description of measured values of electron mobility and saturation velocity applicable to the III-V materials in field effect transistor (FET) applications useful in practicing the present invention. It is also known how to construct FET devices formed of a ternary material using oxide gates. See an article in the RCA Review, Vol. 42, Dec. 1981, pp. 542–556, by P. D. Gardner et al. entitled "$Ga_{0.47}In_{0.53}As$ Metal Insulator Field-Effect Transistors (MISFETs) For Microwave Frequency Applications" for a description for constructing FETs with such oxide gates, particularly in metal insulator field-effect transistors (MISFETs) for microwave frequency applications. The provision of oxide gates in ternary material devices permits the direct coupling of logic gates to simplify thereby the design of circuits. The number of transistors per gate that are needed is greatly reduced using direct coupling logic design.

Despite the attractiveness of ternary material for devices, the design of logic gates utilizing this material has been found to be significantly different from either silicon or GaAs integrated circuits. The speed of operation of any logic gate depends, for the most part, on both the current drive capability of the driven stage and the capacitive loading presented at the output terminals. While a device formed of GaInAs material should be superior in speed to a silicon device of the same dimension, I have discovered, however, that undesirably excessive capacitive loading adversely affecting the operation speed occurs at the output terminals. The capacitive loading is due to the inherent development of an N/P junction. The capacitance of such an N/P junction is so large that it would appear to dominate any additional gate loads that may be connected to the output.

To further complicate this undesirable excessive capacitive effect, I further discovered that if two input driver transistors are connected in parallel to produce an "OR" function, the N+/P junction capacitance will be doubled, further slowing the speed of operation of the logic gate. Unfortunately, the P type layers useful for such devices are required to be relatively highly doped, usually of the order of about $3 \times 10^{16}$ cm$^{-3}$. Such high doping causes the N+/P junction to have a smaller depletion width and a larger capacitance.

SUMMARY OF THE INVENTION

The present invention provides a fast operating ternary (GaInAs) logic gate device, such as an inverter, by minimizing, if not reducing to a minimum, the inherent capacitancy in such devices. This is achieved by having the depletion region extend toward the interface between the substrate and the active region of the device.

The ternary logic gate device of the present invention is based on the discovery that the thickness of a deposited active region of gallium indium arsenide and the dopant concentration thereof must be in a critical relationship to reduce the distributed capacitance of the device. By providing an extremely thin but operative active region of the device with a critical dopant concentration, the charge depletion region is always assured of at least reaching the interface between the active area and the substrate to significantly reduce, if not minimize, the capacitance of the device.

DETAILED DESCRIPTION OF THE VARIOUS EMBODIMENTS

Figure 1:
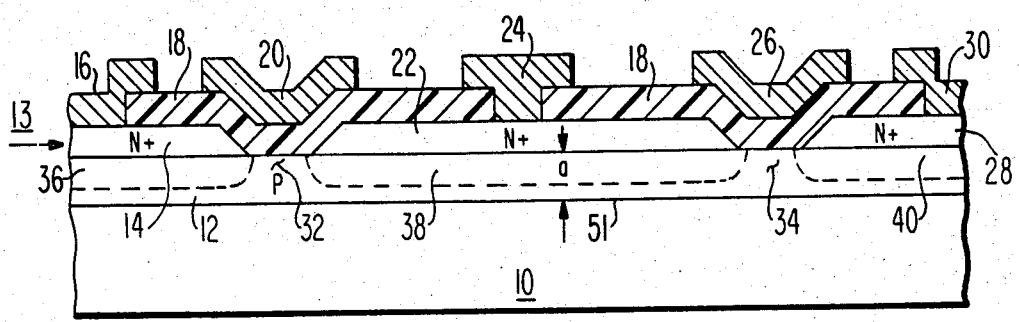
FIG. 1 is a cross-sectional, elevational view of the ternary logic gate device according to one embodiment of the present invention.
Figure 2:
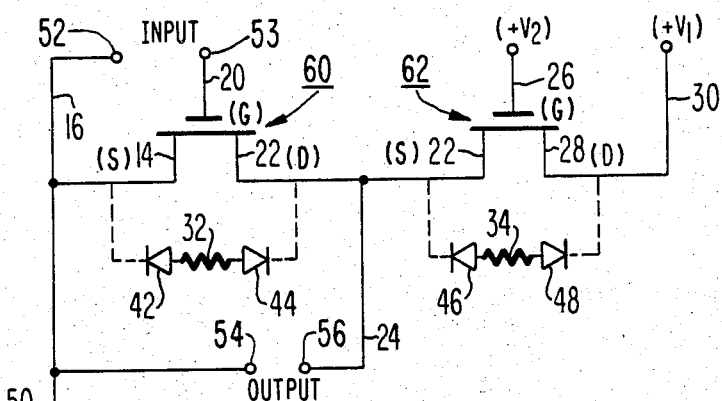
FIG. 2 is an equivalent electrical circuit schematic representation of the device of FIG. 1.
Figure 3:
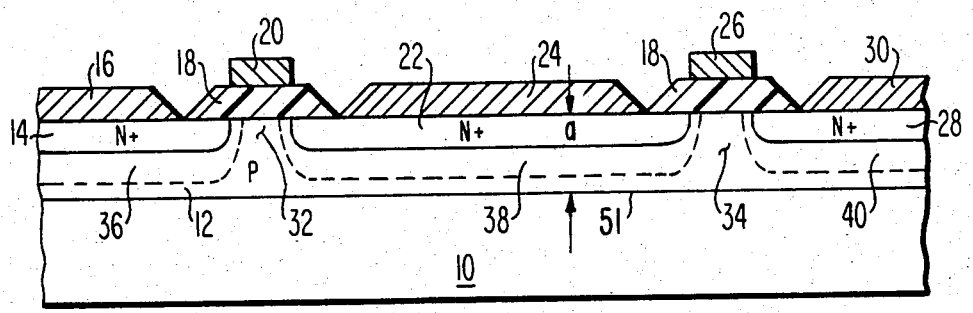
FIG. 3 is a cross-sectional view of another embodiment of the invention.

In the following description similar elements in each of the FIGS. 1, 2 and 3 are numbered identically.

FIG. 1 shows a semi-insulating indium phosphide (InP) substrate 10 having deposited thereon a latticematched active layer 12 of a thickness consisting of a P doped GaInAs layer to provide a P conductivity type layer that has been epitaxially grown. Interface 51 is defined as the boundary between substrate 10 and layer 12. An N+GaInAs layer 13 is deposited over layer 12. This layer 13 is subsequently masked and formed into three discrete, spaced-apart N+regions 14, 22 and 28, the functions of which will be described later. The spacing between adjacent regions 14, 22 and 28 define channel regions 32 and 34, respectively. A layer 18 of silicon oxide is chemically vapor-deposited over the entire structure and thereafter masked and etched. The etched structure is now provided with contacts and leads by forming a trilayer of titanium/platinum/gold which is then masked and etched to provide contacts 16, 24 and 30 while forming gate members 20 and 26. In this manner, gate member 20 is aligned with the channel region 32 while gate member 26 is aligned with its corresponding channel region 34. Charge depletion regions 36, 38 and 40 are arranged according to this invention, as will be described, in association with and generally beneath the N+regions 14, 22 and 28, respectively, to extend to the interface 51 with substrate 10. Note that the depletion regions 36, 38 and 40 extend slightly into the adjacent channel regions 32 and 34.

FIG. 2 shows the equivalent circuit diagram of the logic device of FIG. 1. For convenience, the diagram of FIG. 2 is shown with input terminals 52 and 53 suitably connected to contact 16 and gate member 20, respectively, contact 16 being suitably connected to ground 50. In addition, output terminals 54 and 56 are suitably connected to ground 50 and contact 24, respectively. Contact 24 is connected to the N+region 22, as shown, also in FIG. 1. For convenience and consistency with the structure of the device shown in FIG. 1, region 22 is shown in FIG. 2 as being common to transistors 60 and 62, serving thereby as the drain (D) region of transistor 60 and the source (S) region of transistor 62. A source of bias voltage $+V_2$ is connected to gate 26 while a source of bias voltage $+V_1$ is connected to drain (D) region 28 through contact 30.

Transistors 60 and 62 serve as the driver and load, respectively, of an inverted gate logic circuit responding to an input signal at input terminals 52 and 53 to provide an output signal at terminals 54 and 56. The operation of the inverter circuit of FIG. 2, as embodied in the structure of FIG. 1 and FIG. 3 to be described, is conventional except for the significantly improved propagation delay achieved according to the invention by the reduction in effective capacitance at the output terminals 54 and 56. The effective capacitance at the output terminals 54 and 56 is comprised of the capacitances appearing between the respective discrete regions 14 and 22 and between regions 22 and 28. This capacitance is increased by any charge existing beneath the discrete regions 14, 22 and 28. The effective capacitance, it should be understood, is represented herein to be included in the diodes 42, 44, 46 and 48 to be described.

The diode 42 is formed between source region 14 and channel region 32 while the diode 44, which is oppositely poled to the polarity of diode 42, is formed between the drain region 22 of the transistor 60 and the channel region 32. The symbol of a resistor shown in FIG. 2 for channel region 32 represents the bulk resistance of the material in channel region 32 of FIG. 1. The combination of the effectively back-to-back connected diodes 42 and 44 together with the interposed resistance of channel region 32 provide in conventional devices an undesirably excessively high distributed effective capacitance appearing at the output terminals 54 and 56. Similarly, the transistor 62 consisting of drain region 28, gate member 26, and the common drain/source 22 has a corresponding back-to-back pair of the diodes 46 and 48 with an interposed resistance of channel region 34 formed in parallel with the drain 28 (D) and source 22 (S), respectively. Diodes 46 and 48 likewise provide an undesirably excessive high distributed effective capacitance at the output terminals 54 and 56.

I will now describe how to minimize, or to otherwise reduce to a minimum, the high effective capacitance appearing at the output terminals 54 and 56. I first determined that the minimum thickness of a GaInAs layer 12 that will provide good transistor action is about 0.15 micrometer. By "good" transistor action, I mean a transistor that has large transconductance ($g_m$) per unit gate width. See, for example, the above-identified article in the RCA Review, Dec. 1981 at page 553, describing the relationship of transconductance as a parameter indicative of transistor action. I then determined that a minimum dopant concentration (N) of about $1.0 \times 10^{16}$ cm$^{-3}$ is necessary to provide good transistor action. I then determined that the value of the dopant concentration of $1.0 \times 10^{16}$ cm$^{-3}$ determines the maximum thickness (a) of layer 12 at 0.33 micrometer. To determine the limits of thickness (a) and dopant concentration (N) for the above-mentioned minima, I used the following equation characterizing the depletion region relationship at thermal equilibrium as desired from equation (15a) of S. M. Sze, p. 77, in the book "Physics of Semiconductor Devices."

$$N = 2\epsilon \frac{V_{BI}}{qa^2} \qquad (1)$$

where: $\epsilon=$ dielectric constant of GaInAs (13.7 times the dielectric constant of free space, viz., $8.85 \times 10^{-14}$ F/cm ; $V_{BI}=$ the built-in voltage, i.e., the inherent voltage of the N+/P interface manifested as the difference in FERMI levels between P layer 12 and each of the N+ regions 14, 22, and 28, respectively, in this embodiment 0.7 volts; q = charge of an electron, $1.6 \times 10^{-19}$ coulombs.. N=dopant (acceptor) concentration in the P type GaInAs layer 12; and (a)=GaInAs layer 12 thickness (cm). Since it is necessary that $N \geq 1.0 \times 10^{16}$ cm$^{-3}$ for good device performance, substituting a dopant concentration (N) of $1.0 \times 10^{16}$ cm$^{-3}$ in the above equation (1) and solving for the thickness (a) of layer 12, shows that $(a)_{max} \times 0.33$ micrometer.

Moreover, since the thinnest layer 12 that can produce good operating GaInAs devices is on the order of about 0.15 micrometer, I determined by substituting it in the above equation (1) and solving for (N) that $(N)_{max} = 4.7 \times 10^{16}$ cm$^{-3}$ for a thickness of 0.15 micrometer.

In general, the limits of dopant concentration (N) and layer 12 thickness (a) are as follows:

$$1.0 \times 10^{16} \text{ cm}^{-3} \leq N \leq 4.7 \times 10^{16} \text{ cm}^{-3} \qquad (3)$$

$$0.15 \text{ micrometer} \leq a \leq 0.33 \text{ micrometer} \qquad (3)$$

For any intermediate value of either dopant concentration (N) or tnickness (a), within the above limits as set forth in equations (2) and (3), the proper values (a) or (N) in combination can be determined.

Thus, by way of example, to determine the maximum (N) value, for a thickness (a) of 0.175 micrometer, one would substitute the values mentioned above in equation (1) as follows:

$$N = \frac{(2.0)(13.7)(8.85 \times 10^{-14})(0.70)}{1.6 \times 10^{-19} \times (0.175 \times 10^{-4})^2} \qquad (4)$$

Thus, the dopant concentration $N = 3.5 \times 10^{16}$ cm$^{-3}$ for a layer 12 thickness (a) of 0.175 micrometer.

The respective values of dopant concentration (N) and thickness (a) of layer 12 can be determined more rapidly from a rearrangement of equation (1) as follows:

$$Na^2 = \frac{2\epsilon V_{BI}}{q} = 1.06 \times 10^7 \text{ charge carriers/cm} \qquad (5)$$

The product of $Na^2$ is thus a constant for the parameters described above to achieve complete depletion of the layer 12 beneath the regions 14, 22 and 28. Thus, for any selected value of dopant concentration (N), the thickness (a) can be quickly calculated, and vice-versa.

As known in the art, the capacitance of a P/N junction of a semiconductor is inversely proportional to the depletion. According to the present invention, the depletion width of regions 36, 38 and 40 is extended to the interface 51 to thereby minimize or otherwise reduce to a minimum the capacitance of the N+/P junctions as represented to be included in the respective diodes 42, 44, 46 and 48. While the dashed-line lower edge of the respective regions 36, 38 and 40 are not shown to be extended to the interface 51, it should be understood that the width of the depletion regions 36, 38 and 40 do extend to the interface 51. Some capacitance, it should be noted, exists at the extremities of the depletion regions 36, 38 and 40 within the channel regions 32 and 34.

It will thus be now appreciated that by properly selecting the values of layer thickness (a) and dopant concentration (N), the effective capacitance between output terminals 54 and 56 can be significantly reduced so that it is no longer the dominant factor in the operation of the device. It is the combination of dopant concentration (N) and the corresponding thickness (a) of layer 12, as determined by equation (1), that causes the depletion regions 36, 38 and 40 to be extended to interface 51. Additionally, it has been found that by reducing the thickness (a) of layer 12, the resistance of channel regions 42 is inversely proportionally increased. This is a desirable feature since the resistance in the channel region reduces the loading effects of the diodes. As seen in FIG. 2, diode 44 is effectively connected to diode 42 through the resistance of channel region 32. Similarly, the resistance of channel region 34 is increased serving to reduce the overall capacitance as represented by diodes 46 and 48.

Refer now to FIG. 3 for another embodiment of the invention in which the N+regions 14, 22 and 28 are formed by being implanted into the epitaxially deposited layer 12 by conventional techniques. Note that the thickness (a) of epitaxial layer 12, as shown in FIG. 3, is the fall thickness of epitaxial layer 12 both prior to and after implantation. The embodiments of FIGS. 1 and 3 are otherwise substantially identical in function. In FIG. 3, the selection of the thickness of P layer (12) can be initially determined such that the N+ regions 14, 22 and 28 can be implanted to such a depth as to extend down to interrace 51. In practice, however, it is not recommended to implant fully down to interface 51 in order to reduce the capacitance. Due to the implantation process, it has been found that the implanted donor density suecreases exponentially and thus the maximum densities will not usually fully extend to the interface 51. It is sufficient, however, to implant only deep enough so that the depletion region 38 beneath N+ region 22 fully reaches the interface 51.

Thus, by reducing the thickness (a) of the epitoxically deposited GaInAs layer 12 and by adjusting the value of the acceptor density (N) in the layer to correspond to the thickness (a) according to equations (2), (3) and (4), (5), the output capacitance at terminals 54 and 56 can be reduced to a low value such that the speed of operation of the devices 60 and 62 are very fast. In several cevices, the speed of operation is on the order of 50 picoseconds as measured by the propagation delay between the input 52/53 and output 54/56.

The embodiments of the invention described above, with respect to the epitaxially grown device of FIG. 1 and the implanted device of FIG. 3, are illustrated by a first layer 12 of P conductivity type material and the three discrete layers 14, 22, 28 of N+ conductivity type material. However, it should be understood that the invention contemplates using a complementary type of device wherein the first layer is formed of an N conductivity tvpe material and the three discrete regions 14, 22 and 28 are formed of P+ conductivity type material.

Moreover, while the embodiments of the invention are described with respect to fabricating inverter logic gates, in should be understood that the invention can be used for fabricating NAND gates, NOR gates and other gates of more complex configurations as combinations of such gates. The particular dopant needed to provide the desired conductivity of the various layers or regions, referred to hereinabove, is conventional. For example, in the embodiment of the structure of FIG. 3, zinc was used as the dopant for epitaxial P conductivity type layer 12, and silicon was used as the implanted dopant for the N+ regions 14, 22 and 28.

What is claimed is:

1. A semiconductor device comprising a substrate formed of indium phosphide (InP) having a surface, a first epitaxial layer of a semiconductor material comprising GaInAs of a first conductivity type on said substrate surface and having a surface, a first, second and third discrete region of a second conductivity type material comprising GaInAs along said first layer surface, a depletion region within said epitaxial layer between each of said three discrete regions and said substrate surface, a first and second channel region between, respectively, said first and second and said second and third discrete regions, a first, second and third electrical contact at each of said discrete regions, respectively, the thickness (a) of said first layer having values lying within the range of 0.15 micrometer and 0.33 micrometer and the dopant concentration (N) of said first layer has values lying within the range of $1.0 \times 10^{16}$ cm$^{-3}$ and $4.7 \times 10^{16}$ cm$^{-3}$, whereby said depletion region extends completely within said first layer beneath each of said discrete regions to said substrate surface, whereby said first layer is essentially completely depleted at thermal equilibrium and whereby the capacitance between each of said adjacent discrete regions is reduced towards a minimum.

2. The semiconductor device according to claim 1 wherein the product of said dopant concentration (N) and the square of said first layer thickness (a) is a constant value of $1.06 \times 10^7$ charge carriers/cm.

3. The semiconductor device according to claim 1 wherein said first layer is formed of P conductivity type material and each of said three discrete regions is formed respectively of N+ conductivity type material.

4. The semiconductor device according to claim 1 wherein said first layer is formed of N+ conductivity type material and each of said three discrete regions is formed respectively of P conductivity type material.

5. The semiconductor device according to claim 1 wherein each of said three discrete regions is formed respectively within said surface of said first epitaxial layer.

6. The semiconductor device according to claim 5 wherein each of said three discrete regions is formed respectively by implanting dopant modifiers of the second conductivity type into said first layer to define said discrete regions.

7. The semiconductor device according to claim 1 wherein each of said three discrete regions is on said first laser surface.

8. The semiconductor device according to claim 7 wherein each of said discrete regions is epitaxially deposited on said first layer surface.

9. The semiconductor device according to claim 1 is formed into an inverter circuit by means for connecting a first and second supply voltage to said second and third electrical contacts,
   means for applying an input signal across said first electrical contact and said first channel region; and
   means for generating an inverted output signal across said first electrical contact and said second discrete region.

10. The inverter circuit according to claim 9 wherein the propagation delay of said input signal to said output signal is on the order of 50 picoseconds.

* * * * *

UNITED STATES PATENT AND TRADEMARK OFFICE
CERTIFICATE OF CORRECTION

PATENT NO. : 4,639,752

DATED : Jan. 27, 1987

INVENTOR(S) : Walter R. Curtice

It is certified that error appears in the above-identified patent and that said Letters Patent is hereby corrected as shown below:

Col. 1, line 49, change "The" to --This--.

Col. 5, line 14, change "42" to --32--.

Col. 5, line 36, change "suecreases" to --decreases--.

Col. 6, line 52, change "laser" to --layer--

Signed and Sealed this

Eleventh Day of August, 1987

Attest:

DONALD J. QUIGG

*Attesting Officer*  *Commissioner of Patents and Trademarks*